United States Patent [19]
Knowlton

[11] 3,967,273
[45] June 29, 1976

[54] METHOD AND APPARATUS FOR USING PUSHBUTTON TELEPHONE KEYS FOR GENERATION OF ALPHA-NUMERIC INFORMATION

[75] Inventor: Kenneth Charles Knowlton, Plainfield, N.J.

[73] Assignee: Bell Telephone Laboratories, Incorporated, Murray Hill, N.J.

[22] Filed: Mar. 29, 1974

[21] Appl. No.: 456,029

[52] U.S. Cl. ............... 340/365 S; 178/17 C; 179/90 K; 197/100
[51] Int. Cl.² ................................ H04L 15/04
[58] Field of Search......... 340/365 R, 365 S, 365 A; 178/17 R, 17 C, 21, 79; 179/90 K, 90 R, 2 DP; 197/11, 4, 100

[56] References Cited
UNITED STATES PATENTS

| | | |
|---|---|---|
| 2,189,023 | 2/1940 | Ayres.................................. 197/9 |
| 3,225,883 | 12/1965 | Ayres.................................. 197/11 |
| 3,526,892 | 9/1970 | Bartlett et al.................... 340/365 S |
| 3,530,239 | 9/1970 | Corell et al.......................... 178/17 |
| 3,675,513 | 7/1972 | Flanagan et al................ 179/84 VF |
| 3,833,765 | 9/1974 | Hilborn et al........................ 178/79 |

OTHER PUBLICATIONS
Stuckert, *IBM Technical Disclosure Bulletin*, "Input Keyboard," Aug. 1971, pp. 952–959.

*Primary Examiner*—John W. Caldwell
*Assistant Examiner*—James J. Groody
*Attorney, Agent, or Firm*—R. O. Nimtz

[57] ABSTRACT

The disclosure comprises a method and apparatus for using a pushbutton telephone keyboard in which a signal sequence representing a unique symbol is generated by pushing a first button on which the desired symbol is located, each button being labeled with at most a three by three array of symbols, and pushing a second button, which is indicated by the position of the symbol in the array on the first button. Letters and numbers are arranged corresponding to the arrangement of a standard typewriter keyboard, insuring that anyone familiar with the location of letters and numbers on a typewriter can quickly find the letter on the keyboard.

7 Claims, 7 Drawing Figures

FIG. 3
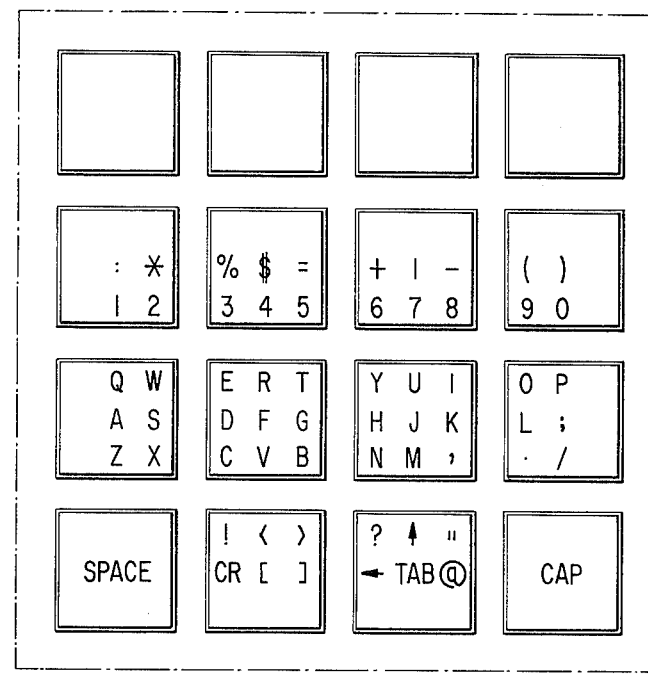
FIG. 4
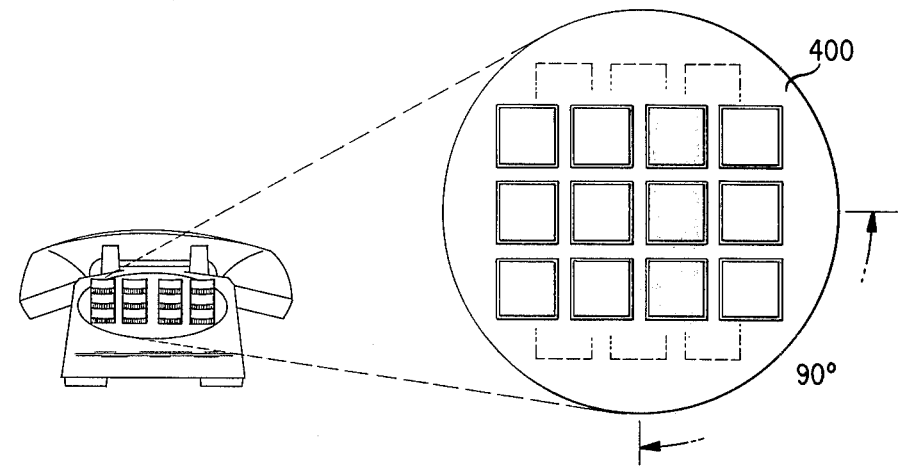
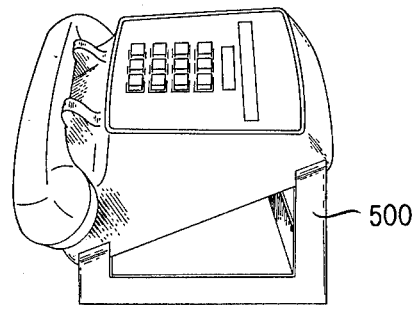
FIG. 5

METHOD AND APPARATUS FOR USING PUSHBUTTON TELEPHONE KEYS FOR GENERATION OF ALPHA-NUMERIC INFORMATION

BACKGROUND OF THE INVENTION

The general field of this invention is of alpha-numeric character coding keyboards. More specifically, this invention pertains to apparatus and methods for using a rectangular array of pushbuttons, such as the pad of buttons of a pushbutton telephone set, to generate and transmit alpha-numeric information.

The pushbutton telephone has long been recognized as a possibly convenient access terminal to a digital computer. Inventors have devised ways to use the limited number of buttons to allow the sending of alpha-numeric information over telephone lines to a distant computer.

U.S. Pat. No. 3,675,513 describes one such method. A telephone pushbutton dial is left unaltered and the labels normally appearing on the telephone set are used as an aid in determining how to generate a character. Two separate modes are required to generate alphabetic characters and numbers. The alphabetic mode and the numeric mode are generated respectively by three pushes of the asterisk (*) button and the octothorpe (#) button. In the numeric mode, the numbers of the buttons indicate the button to be pushed. In the alphabetic mode, a letter is generated by pushing the button a number of times equal to the numerical position in the three letter sequence in which the button is labeled.

Another way to generate alpha-numeric information, by using a pushbutton telephone set, was proposed in an article by Leon Davidson, *Datamation*, "A Pushbutton Telephone for Alpha-Numeric Input," April, 1966, pp. 27–29. This proposal left the telephone dial labels intact and described a method for generating letters by using the letters associated with the buttons in conjunction with the asterisk (*) and octothorpe (#) buttons. These buttons are on the left and right columns of the fourth row of an ordinary three column-four row pushbutton keyboard. A letter appearing in a three letter sequence is identified by pushing the left button to identify the left letter, the right button to identify a right letter, followed by pushing the button containing the desired letter. Both asterisk and octothorpe buttons are pushed in succession to identify a middle letter. If neither asterisk or octothorpe buttons are pushed, the digit would be indicated by pushing a button labeled with a number.

U.S. Pat. No. 3,381,276 disclosed a method of generating alpha-numeric information by using a pushbutton telephone set where two buttons are depressed simultaneously.

The disadvantage of the prior art attempts for using a small rectangular array of buttons, such as with a pushbutton telephone set, has been with the slowness and awkwardness of use. It is very difficult for the ordinary person to generate alphabetic text by first finding a letter to be generated on the buttons, remembering the code by which it will be generated, and going on to the next letter.

In addition to the inherent difficulties of remembering new sequential push codes, simultaneous push codes, etc., the number of symbols available for use on an ordinary pushbutton telephone keyboard is limited. For example, while all letters except the letters Q and Z and all the digits from zero through nine appear on the keyboard, there is no convenient way to generate other symbols normally appearing on a typewriter keyboard. Special symbols used in generating computer program listings are not available nor are symbols to provide back space, capital letters, etc.

It is therefore an object of this invention to provide methods and apparatus which will allow an ordinary user to use a small keyboard to generate alphanumeric information with little training and with reasonable speed.

It is another object of this invention to provide an increased number of symbols to the user than an ordinary pushbutton telephone keyboard provides, giving the user the ability to generate ordinary English text or special symbols used in generating computer program listings.

SUMMARY OF THE INVENTION

This invention is a new method and system for the use of a small keyboard such as a telephone pushbutton keyboard for the generation of alpha-numeric symbols in an efficient manner. The invention comprises a two-push method of using a pushbutton telephone keyboard in which a symbol is generated by pushing a first button on which the desired symbol is located, each button being labeled with at most a three by three array of symbols, and pushing a second button, which is indicated by the position of the symbol in the array on the first button. Letters and numbers are arranged corresponding to the arrangement of a standard typewriter keyboard, insuring that anyone familiar with the location of letters and numbers on a typewriter can quickly find the letter on the keyboard.

Advantages of this invention include simplicity, low cost, and versatility when compared with prior art methods and apparatus for the use of a pushbutton telephone to generate alpha-numeric information.

BRIEF DESCRIPTION OF THE DRAWINGS

FIG. 3 shows the keyboard arrangement of FIG. 1 for a sixteen button pushbutton telephone set.

FIG. 4 shows a modified twelve button telephone set where the pushbutton pad can be rotated by ninety degrees.

FIG. 5 shows a cradle for a twelve button pushbutton telephone set such that a four column-three row array of buttons is presented to the user.

DETAILED DESCRIPTION

This invention pertains to apparatus and methods for using a keyboard of a pushbutton telephone set as a device for generating signals representing alpha-numeric information. The invention includes a novel pushbutton keyboard in that each button is labeled with a three by three array of symbols. The symbols are arranged to simulate the arrangement of a standard typewriter keyboard. A user generates a desired symbol by first pushing the button on which the symbol is found. The position of the symbol in the array dictates the location of a second button to be pushed. The sequence of two pushes of the pushbutton keyboard constitutes a unique signal sequence which is transmitted over an ordinary voice-grade telephone circuit to a remote receiver. The generated signal sequence can be translated into digital signals, decoded to represent an alpha-numeric character and stored in a computer memory representing alpha-numeric text. A complete system can be provided by transmitting either a voice recording of the generated character back through the ear piece of the telephone set, or a warning signal where the user has pushed an illegal sequence of buttons.

Figure 1:
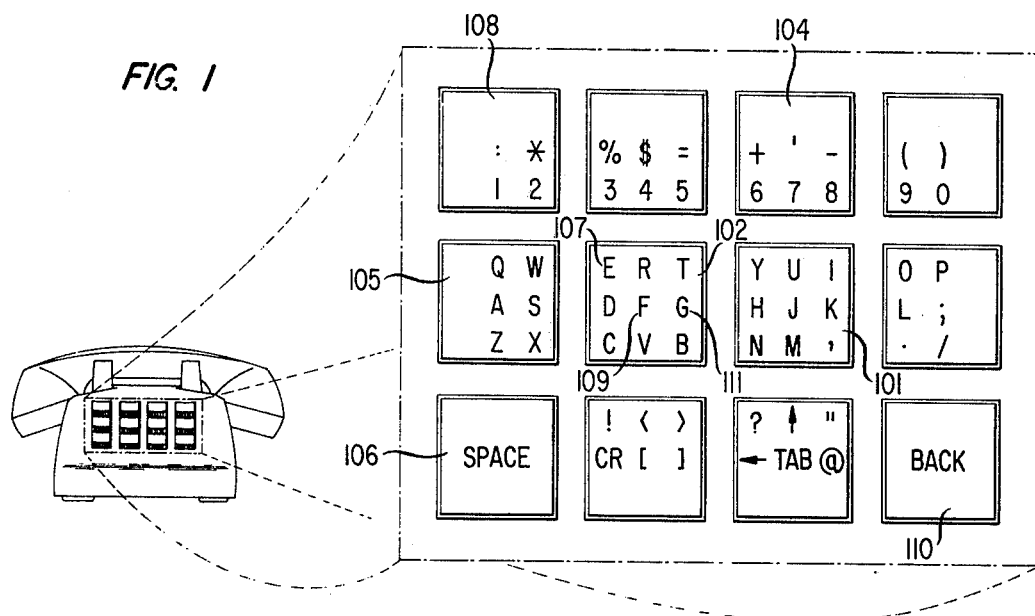
FIG. 1 shows a pushbutton arrangement for a twelve button telephone set where the buttons are oriented in a four column-three row orientation and individual buttons are relabeled such that alphabetic letters and digits are arranged similar to their arrangement on an ordinary typewriter keyboard.

FIG. 1 shows the preferred keyboard arrangement of this invention. The twelve buttons of an ordinary pushbutton telephone set are arranged in a four column-three row array. Each button is relabeled so that ordinary labels on the telephone keyboard are not visible. Relabeling is accomplished mechanically by physically superimposing new labels on the buttons or by optical means such as those described in copending application, Ser. No. 422,995, filed Dec. 10, 1973, by K. C. Knowlton, and assigned to the assignee of the present invention.

Each label contains at most nine symbols arranged in a three by three array. Buttons 101 and 102 have a full three by three array of symbols. Other buttons, e.g., 104, 105, are arranged with less than a full number of symbols in the array. For example, button 104 has the top row of symbols blank. Button 105 has the left column of symbols left blank. Other buttons 106, 110 are labeled with but one symbol. The labeling is arranged such that the alphabetic and numeric characters appear in the same arrangement as in an ordinary typewriter keyboard. The second row of buttons contains all the alphabetic characters plus punctuation symbols, semicolon, comma, period, and slash. Numerical digits 1 through 0 appear in the first row of buttons and are located immediately above the alphabetic letters as in an ordinary typewriter. Additional characters are located on first and third row buttons.

An alpha-numeric character is generated by pushing two buttons in sequence. The first button to be pushed is the button on which the desired character is found. For example, suppose the user desires to generate the letter 'E' 107. He finds letter 'E' 107 labeled on button 102 and pushes it once. He must then decide which button must be pushed to complete the two-push sequence for the generation of the character. The position of the letter 'E' 107 on the button 102 indicates which is the next button to be pushed. Because the letter 'E' 107 appears in the "northwest" position of the three by three array of characters on button 102, the button to the northwest of button 102, button 108, is pushed to complete the sequence of two pushes. The letter 'G' 111 is generated by first pushing button 102 and then button 101.

If a character is located in the center of a three by three labeling array, the button on which the character is located is pushed twice in succession. For example, the letter 'F' 109 appears in the center of the three by three array of letters on button 102. Button 102 is pushed twice to generate the letter 'F'.

A general rule can be stated for the generation of a character where characters are arranged on three by three arrays on buttons: Two buttons are depressed in sequence, the first button pushed being the one on which the character is located, the second button pushed being the closest to the first button along an imaginary vector which originates in the center of the first button along a line through the desired character, the second button being identical to the first button if the character is located in the center of the three by three labeling array.

Two buttons in FIG. 1 contain but one label: button 106 and 110 are labeled with 'SPACE' and 'BACK'. These buttons are pushed only once to produce a signal indicating the desired function. If the user desires a space between characters, he pushes button 106; a back space is generated by pushing button 110.

One advantage over the prior art of this invention is the fact that alphabetic letters and digits are arranged in a fashion similar to that of an ordinary typewriter. A user of this invention need not learn a new arrangement of characters on his first use of this invention, if he has familiarity with a typewriter keyboard. It has been found that word speeds in generating English language text, according to the methods described here exceed those of prior art attempts for using a pushbutton telephone set as an input computer terminal.

Another advantage of this invention is the large number of characters which can be generated. The additional characters can be used as the special symbols required for editing and preparing source programs for a digital computer.

Figure 2:
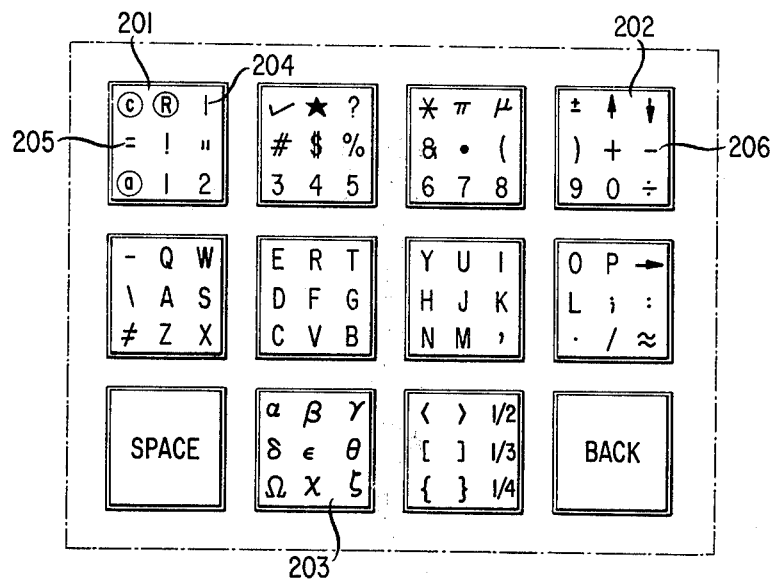
FIG. 2 shows an alternative keyboard arrangement for a twelve button pushbutton telephone set of FIG. 1.

The number of characters which can be generated is increased over those shown in FIG. 1 if the first and third rows and the first and fourth columns are considered adjacent to one another. FIG. 2 shows a keyboard labeling basically like the one of FIG. 1 but with additional characters in the first and third rows and first and fourth columns. Button 201 in FIG. 2, equivalent to button 108 in FIG. 1, can be labeled with symbols in all positions of the three by three labeling array. For example, the label 204 is generated by first pushing button 201 and then pushing button 203. Character 205 is generated by first pushing button 201 and then button 202. Character 206 is generated by pushing button 202 and then button 201.

In order to achieve the standard keyboard arrangement for buttons, each labeled with a three by three labeling array, it is necessary to have a row of at least four buttons. For ease of operation it is desirable that four columns of buttons be presented to the user. FIG. 3 shows a sixteen button keyboard which offers a four column-four row array of buttons. The top three rows of buttons can be used, or the bottom three, as shown in FIG. 3 where the labeling array of FIG. 1 is repeated.

FIG. 4 shows how a twelve button keyboard can be mounted on a rotatable plate inserted in the face of the telephone set. In one position, a three column-four row orientation allows normal use of the telephone set. By rotating the plate 90 degrees, a four column-three row array of buttons is presented to the user for use in alpha-numeric character generation.

Figure 6:
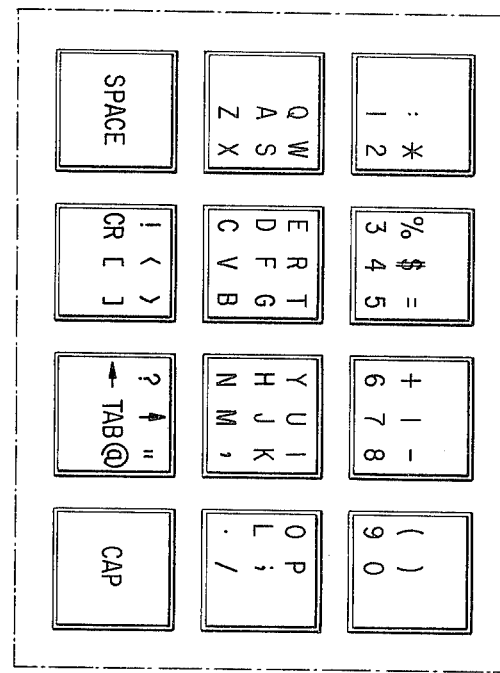
FIG. 6 shows a keyboard arrangement for a twelve button pushbutton telephone set in the ordinary three column-four row orientation where individual buttons are relabeled such that alphabetic letters and digits are arranged similar to the arrangement on an ordinary typewriter keyboard.
Figure 7:
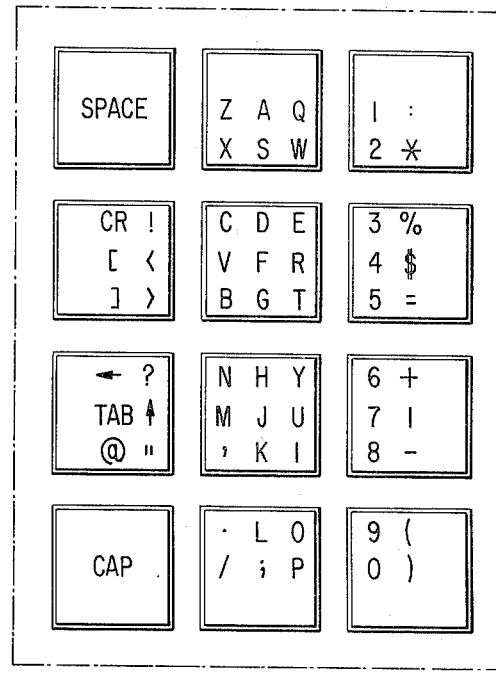
FIG. 7 shows a labeling arrangement similar to that of FIG. 6 where each symbol is rotated counterclockwise ninety degrees.

FIG. 5 shows a cradle 500 for holding a twelve button telephone set in an orientation such that a four column-three row array of buttons faces the user. Some users find it acceptable to use the telephone keyboard as in FIG. 6 without reorienting it as in FIG. 5. FIG. 7 shows an alternative labeling where each character is in the same position as to its position in FIG. 6, but is orientated in the normal upright position. The user of the telephone set with labeling as in FIG. 7 must mentally rotate the letters 90° in the clockwise direction, and then follow the two-push sequence as described previously to generate a desired character.

It is apparent that there has been provided, in accordance with the invention, a novel method and keyboard which fully satisfy the objects, aims and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications and variations as fall within the spirit and scope of the appended claims.

What is claimed is:

1. A keyboard comprising an array of buttons with at least one button bearing a character array wherein the position of a character in said character array is indicative of the relative location of the second of a sequence of two buttons to be pushed in sequence for that character.

2. A keyboard according to claim 1 wherein said array comprises at least twelve buttons of four columns and three rows wherein one row of four buttons contains buttons each labeled with a three by three array of unique alphabetic characters or blanks, said characters oriented one to another as in the standard typewriter keyboard arrangement.

3. The keyboard of claim 2 wherein a four button row immediately above said row labeled with alphabetic characters contains buttons with three by three labeling arrays wherein the bottom row of each labeling array contains unique numerical digits, each arranged in the standard typewriter orientation with respect to the alphabetic characters on the buttons below.

4. The keyboard of claim 3 wherein labeling arrays filled with neither alphabetic characters or numerical digits contain blanks, punctuation symbols, or special purpose symbols.

5. The method of using an input signaling device containing a plurality of buttons arranged in rows and columns each of said buttons labeled with at most nine alpha-numeric characters in a three by three array, comprising the following steps:
pushing a first button containing a desired character in its three by three labeling array; and
thereafter pushing a second button closest to said first button along a vector which originates in the center of said first button along an imaginary line through said character, the second button being identical to the first button if the character lies in the center of the three by three labeling array.

6. The method of claim 5 wherein the first and last columns of buttons are considered adjacent to each other and the first and last rows of buttons are considered adjacent to each other when determining said second closest button.

7. The method of using an input signaling device containing a plurality of buttons arranged in rows and columns wherein at least one button bears a character array indicative of a sequence of two buttons to be pushed, comprising the following steps,
pushing a first button containing a desired character in its character array, and
pushing a second button which bears the same geometric relation to the first button as the character bears to the center of the character array, the second button being identical to the first button if the character lies in the center of the geometric array.

* * * * *